United States Patent [19]

Sakai et al.

[11] Patent Number: 4,780,427
[45] Date of Patent: Oct. 25, 1988

[54] BIPOLAR TRANSISTOR AND METHOD OF MANUFACTURING THE SAME

[75] Inventors: Tetsushi Sakai, Atugi; Yoshiji Kobayashi, Tokyo, both of Japan

[73] Assignee: Nippon Telegraph and Telephone Corporation, Tokyo, Japan

[21] Appl. No.: 104,544

[22] Filed: Sep. 29, 1987

Related U.S. Application Data

[62] Division of Ser. No. 858,618, May 1, 1986, abandoned.

[30] Foreign Application Priority Data

May 7, 1985 [JP] Japan ................................. 60-96422

[51] Int. Cl.$^4$ ............................................ H01L 29/70
[52] U.S. Cl. ........................................ 437/33; 437/46; 437/50; 437/62; 437/157; 437/162; 437/968; 437/986; 357/34
[58] Field of Search ................. 148/DIG. 11; 357/34, 357/35, 59 H; 437/36, 33, 38, 46, 50, 62, 157, 162

[56] References Cited

U.S. PATENT DOCUMENTS

| | | | |
|---|---|---|---|
| 3,600,651 | 8/1971 | Duncan | 357/59 H |
| 3,611,067 | 10/1971 | Oberlin et al. | 357/59 H |
| 4,106,051 | 8/1978 | Dormer et al. | 357/71 |
| 4,124,934 | 11/1978 | De Brebisson | 29/590 |
| 4,157,269 | 6/1979 | Ning et al. | 148/1.5 |
| 4,160,991 | 7/1979 | Anantha et al. | 357/49 |
| 4,431,460 | 2/1984 | Barson et al. | 357/34 X |
| 4,531,282 | 7/1985 | Sakai | 29/578 |

OTHER PUBLICATIONS

Sakurai et al., A New Transistor Structure for High Speed Bipolar LSI, Proc. 11th Conf. Solid State Dev., Tokyo (1979), Japan J. Appl. Phys., 19 (1980), pp. 181–185.

"Electronics Letters", vol. 18, No. 8, pp. 283–284, Apr. 14, 1983.

"A 30 ps Bipolar IC Using Super Self-Aligned Process Technology", Extended Abstracts of the 16th Conference on Solid State Devices and Materials, 1984, pp. 209–212.

"Reactive Ion Etching of Aluminum Using SiCl$_4$", Journal of Vacuum Science & Technology, vol. 20, 1982, pp. 186–190.

Primary Examiner—Olik Chaudhuri
Attorney, Agent, or Firm—Townsend & Townsend

[57] ABSTRACT

A bipolar transistor includes collector, base and emitter regions. The collector region consists of a first semiconductor region of a first conductivity type and formed in contact with a surface of a semiconductor layer. The base region consists of a second semiconductor region of a second conductivity type formed within the collector region to be in contact with the surface of the semiconductor layer. The emitter region consists of a third semiconductor region of the first conductivity type formed within the base region to be in contact with the surface of the semiconductor layer. The transistor also includes collector, base, and emitter electrodes. The collector and base electrodes are connected to the collector and base regions at opposite edges of a single opening formed in a field insulating film covering the surface of the semiconductor layer. The collector and base electrodes consist of a conductor. The emitter electrode is connected to the emitter region and consists of a conductor. The transistor further includes first and second insulating interlayers. The first insulating interlayer is formed between the collector and emitter electrodes. The second insulating interlayer is formed between the emitter and base electrodes. A distance between the collector and emitter electrodes on the surface of the semiconductor layer is substantially the same as that between the emitter and base electrodes.

7 Claims, 24 Drawing Sheets

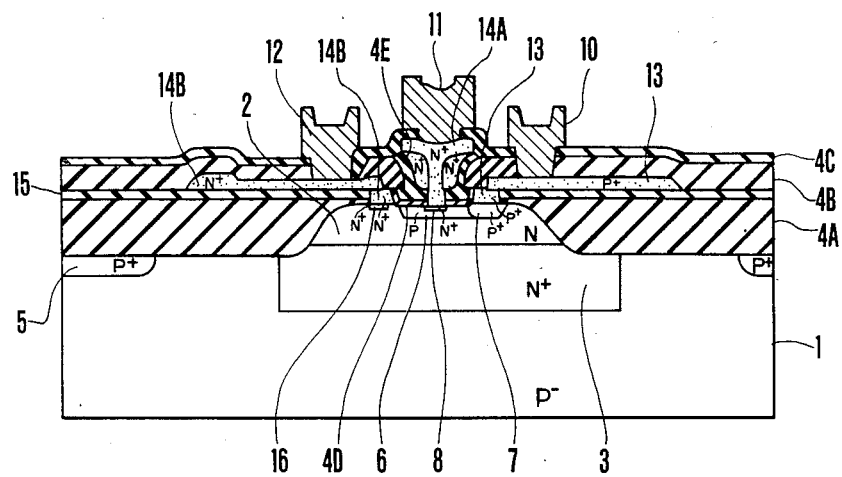
F I G. 1(A)
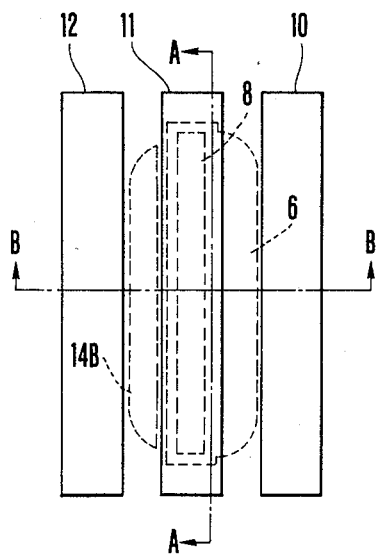
F I G. 1(B)

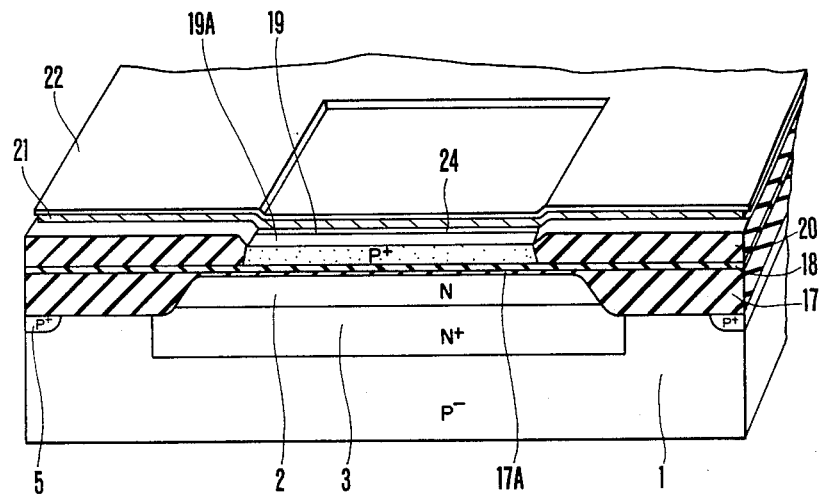
F I G. 6(A)
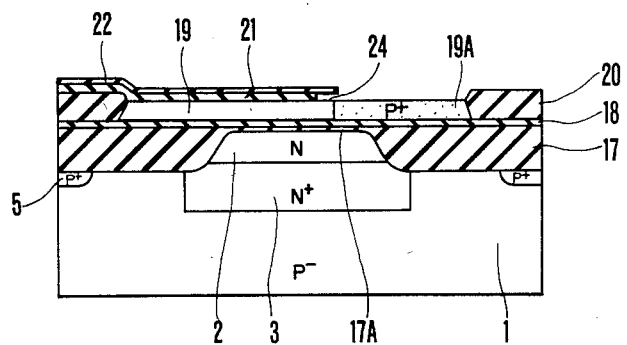
F I G. 6(B)

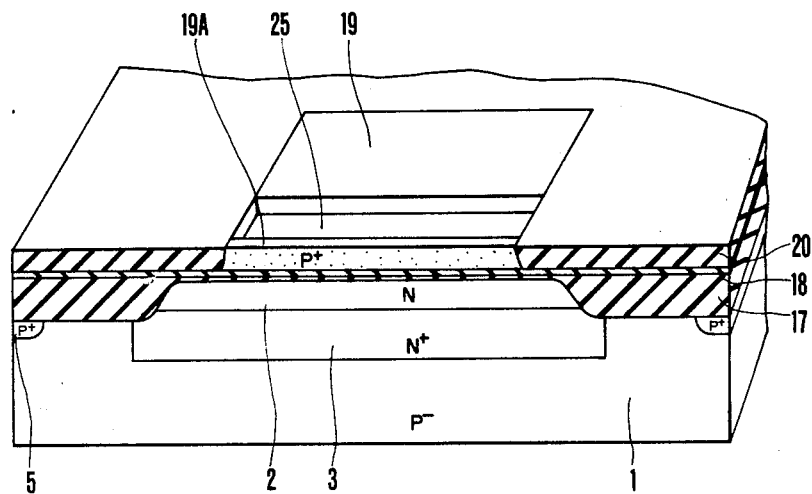
F I G. 7 (A)
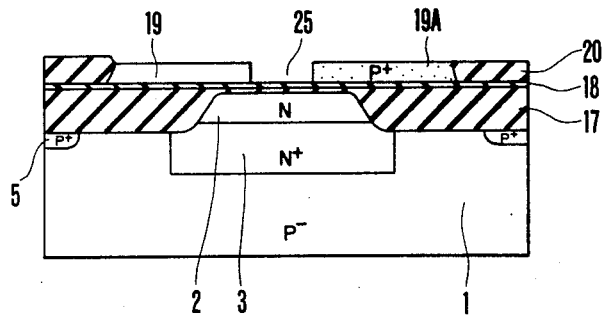
F I G. 7 (B)

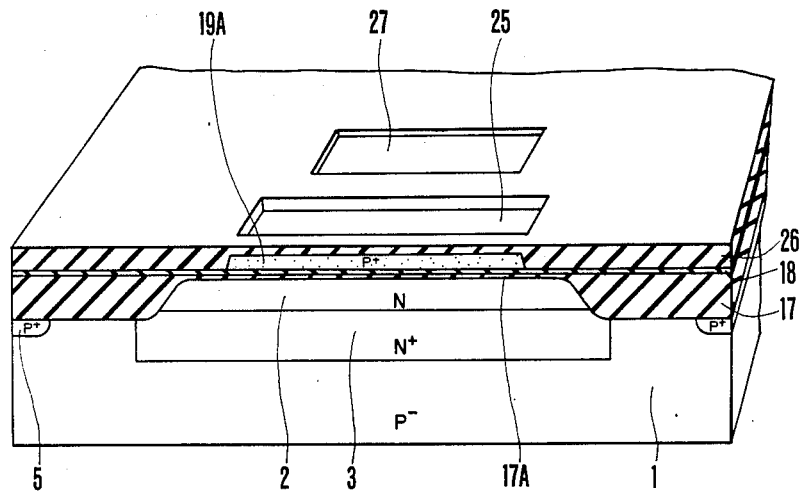
F I G. 8 (A)
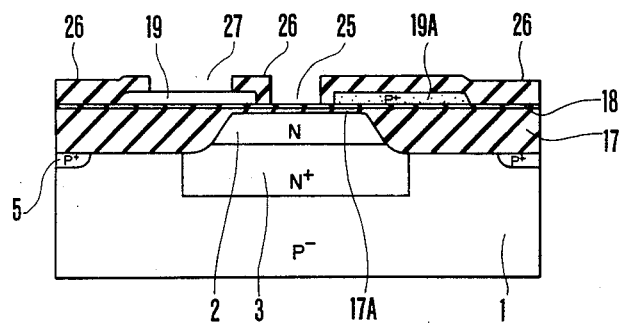
F I G. 8 (B)

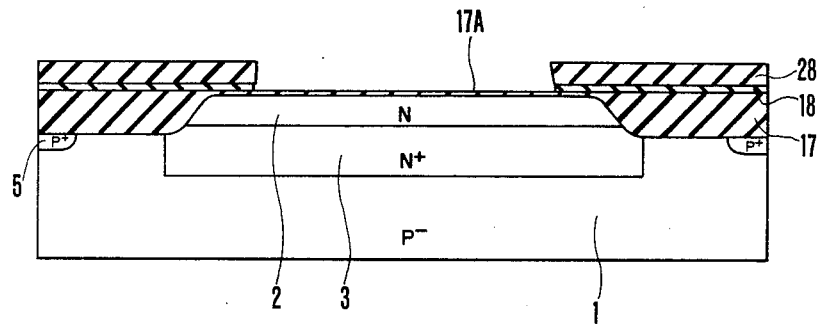
F I G.11 (A)
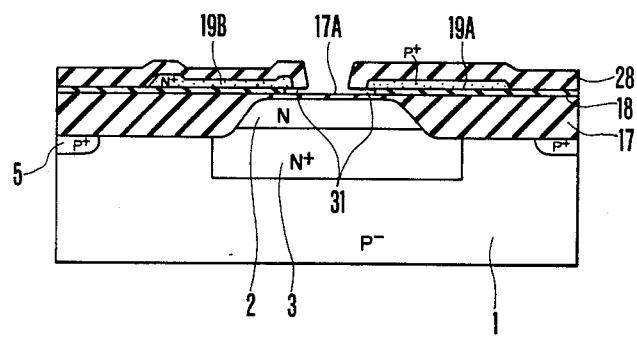
F I G.11 (B)

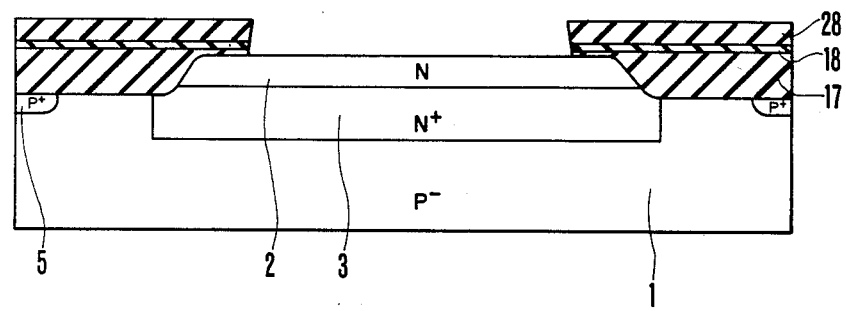
F I G. 13 (A)
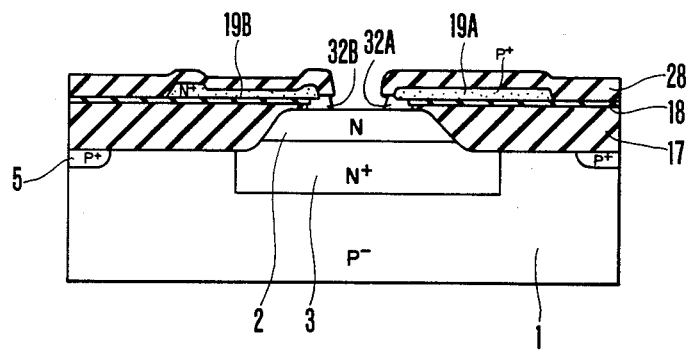
F I G. 13 (B)

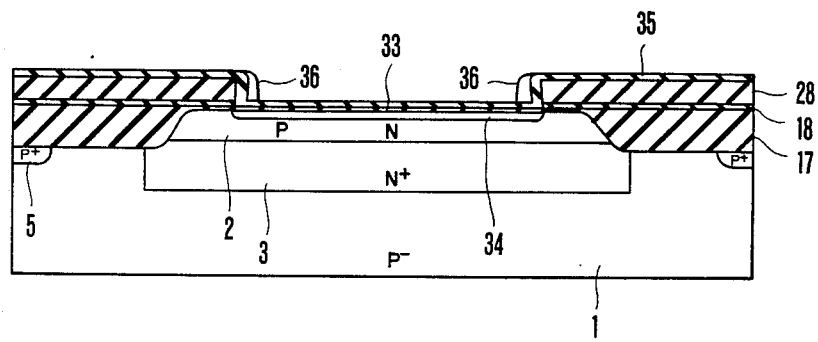
F I G. 15(A)
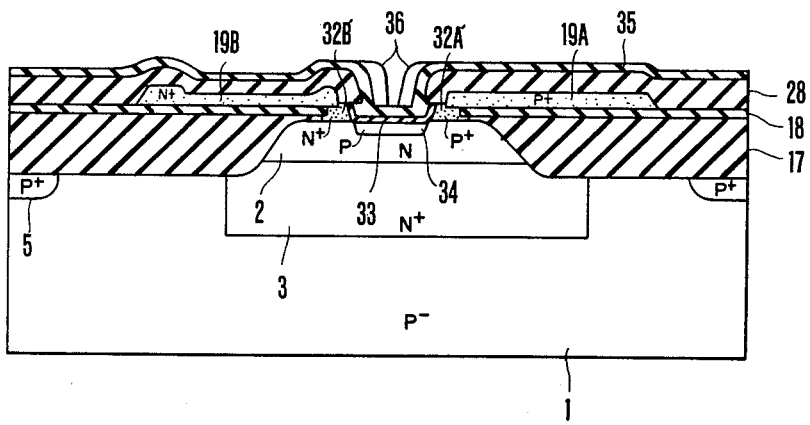
F I G. 15(B)

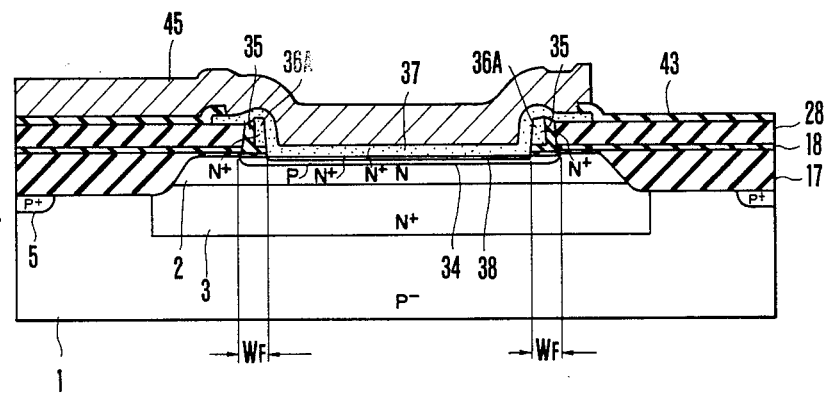
F I G. 18(A)
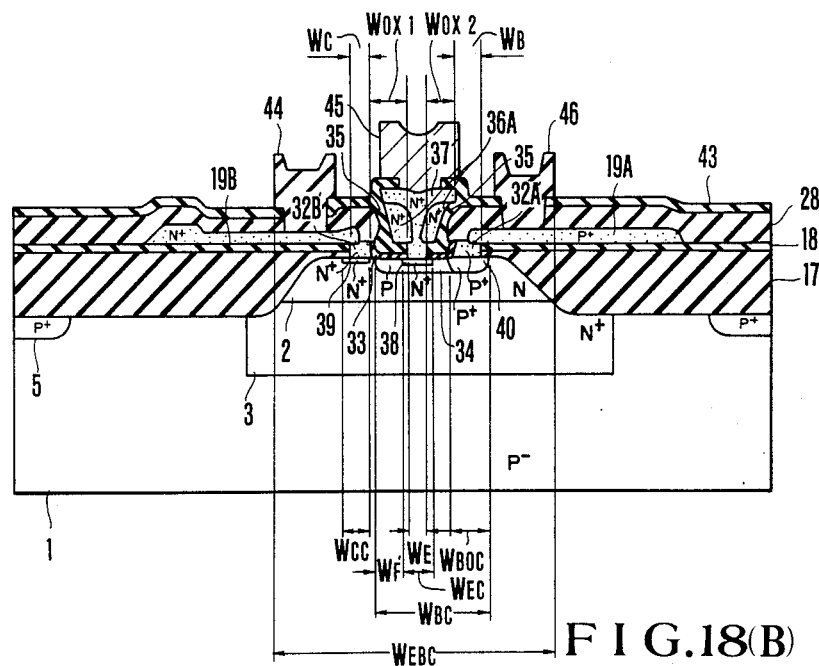
F I G. 18(B)

BIPOLAR TRANSISTOR AND METHOD OF MANUFACTURING THE SAME

This is a division of application Ser. No. 858,618, filed May 1, 1986, now abandoned.

BACKGROUND OF THE INVENTION

The present invention relates to a bipolar transistor used in various semiconductor integrated circuits or the like and a method of manufacturing the same and, more particularly, to a vertical bipolar transistor and a method of manufacturing the same.

A typical example of a conventional high-density, high-speed bipolar transistor for a semiconductor IC as described in Electronics Letter, Vol. 19, No. 8, PP. 283-284, Apr. 14, 1983 is illustrated in FIG. 27. Referring to FIG. 27, reference numeral 1 denotes a $p^-$-type silicon substrate; 2, an n-type epitaxial layer constituting a collector region; 3, an $n^+$-type buried layer; 4A to 4E, oxide films; 5, a $p^+$-type channel cut layer; 6, a base region; 7, a base contact region; 8, an emitter region; 9, an intrinsic transistor region (the region surrounded by a broken line); 10, a base metal electrode; 11, an emitter metal electrode; 12, a collector metal electrode; 13, a polysilicon electrode layer doped with a p-type impurity; 14A and 14B, polysilicon electrode layers containing an n-type impurity; and 15, a nitride film.

With the structure in FIG. 27, the region 9 is the region indispensable to transistor operation. Formation of the base, collector and emitter electrodes constituted by polysilicon layers at positions near the region 9 decreases parasitic capacitances and resistances. However, when isolation of the electrodes and mask alignment margins are taken into consideration, the actual transistor size is larger than the region 9. The 1-$\mu$m rule is applied to the example in FIG. 27. Although the emitter electrode constituted by the polysilicon layer 14A and the base electrode constituted by the polysilicon layer 13 are self-aligned and formed on the substrate surface adjacent to each other without degrading transistor characteristics, the distance between the emitter and collector electrodes cannot be decreased since it is determined by a photolithographic pattern rule during formation of the underlying films prior to the formation of electrodes. Both the junction capacitance between the $p^-$-type silicon substrate 1 and the $n^+$-type buried layer 3, serving as the collector region, and the area occupied by the transistor as a whole are increased. High-speed operation and high density cannot be achieved. In order to form vertical npn and pnp transistors on a single substrate to prepare a complimentary bipolar transistor in the same manner as the vertical npn transistor in FIG. 1, a complicated fabrication process is required. On the other hand, if the npn and pnp transistors are constituted by vertical and lateral transistors, respectively, the electrical characteristics of the pnp transistor are poor.

SUMMARY OF THE INVENTION

It is, therefore, a principal object of the present invention to provide a bipolar transistor wherein a transistor area can be significantly reduced.

It is another object of the present invention to provide a method of manufacturing the above bipolar transistor.

It is still another object of the present invention to provide a high-speed bipolar transistor.

It is still another object of the present invention to provide a method of manufacturing the above bipolar transistor.

According to an aspect of the present invention a bipolar transistor is provided which comprises: a collector region consisting of a first semiconductor region of a first conductivity type, the collector region being formed in contact with a surface of a semiconductor layer; a base region consisting of a second semiconductor region of a second conductivity type formed within the collector region to be in contact with the surface of the semiconductor layer; an emtter region consisting of a third semiconductor region of the first conductivity type formed within the base region to be in contact with the surface of the semiconductor layer; collector and base electrodes connected to the collector and base regions at opposite edges of a single opening formed in a field insulating film covering the surface of the semiconductor layer, the collector and base electrodes consisting of a conductor; an emitter electrode connected to the emitter region and consisting of a conductor; a first insulating interlayer formed between the collector electrode and the emitter electrode; and a second insulating interlayer formed between the emitter electrode and the base electrode, wherein a distance between the collector and emitter electrodes on the surface of the semiconductor layer is substantially the same as that between the emitter electrode and the base electrode.

According to another aspect of the present invention a method of manufacturing a bipolar transistor is provided which comprises the steps of: forming a first insulating film as a field insulating film on a semiconductor substrate having a collector region of a first conductivity type; forming a first nondoped semiconductor layer on the first insulating film; oxidizing the first nondoped semiconductor layer except for a part of the collector region to form a second insulating film; doping an impurity of a second conductivity type in part of a region of the first nondoped semiconductor layer, thereby forming a first doped region; partially etching a part of a nondoped portion of the first nondoped semiconductor layer which is adjacent to the first doped region and located on the collector region, thereby forming a groove in the first nondoped semiconductor layer; doping an impurity of the first conductivity type to form a second doped region in a region of the first nondoped semiconductor layer which excludes the first doped region; side-etching the first insulating film in the groove excluding a vicinity of the second insulating film to expose parts of lower surfaces of the second doped semiconductor layer of the first conductivity type and the first doped semiconductor layer of the second conductivity type; filling side-etched portions with a second semiconductor layer; doping an impurity of the second conductivity type in a surface of the collector region in the groove to form a base region; forming a third insulating film and a third semiconductor layer on the entire surface; removing the third insulating film and the third semiconductor layer except for portions on side wall of the groove by using anisotropic etching to expose a surface of the base region at the center of the groove; forming a fourth semiconductor layer containing an impurity of the first conductivity type on the surface of the base region and in a region surrounded by the third insulating film and the third semiconductor layer; and diffusing the impurity of the first conductivity type from the fourth semiconductor layer into the base region to form an emitter region.

BRIEF DESCRIPTION OF THE DRAWINGS

FIG. 1(A) is a sectional view showing an npn bipolar transistor according to an embodiment of the present invention;

FIG. 1(B) is a plan view of the transistor in FIG. 1(A);

FIGS. 2(A) to 18(B) show the steps for manufacturing the bipolar transistor in FIG. 1(A), in which FIGS. 2(A), 3(A), . . . 8(A) are sectional perspective views thereof and FIGS. 2(B), 3(B), . . . 8(B), 9(A), . . . 18(B) are sectional views thereof;

DESCRIPTION OF THE PREFERRED EMBODIMENTS

Figure 27:
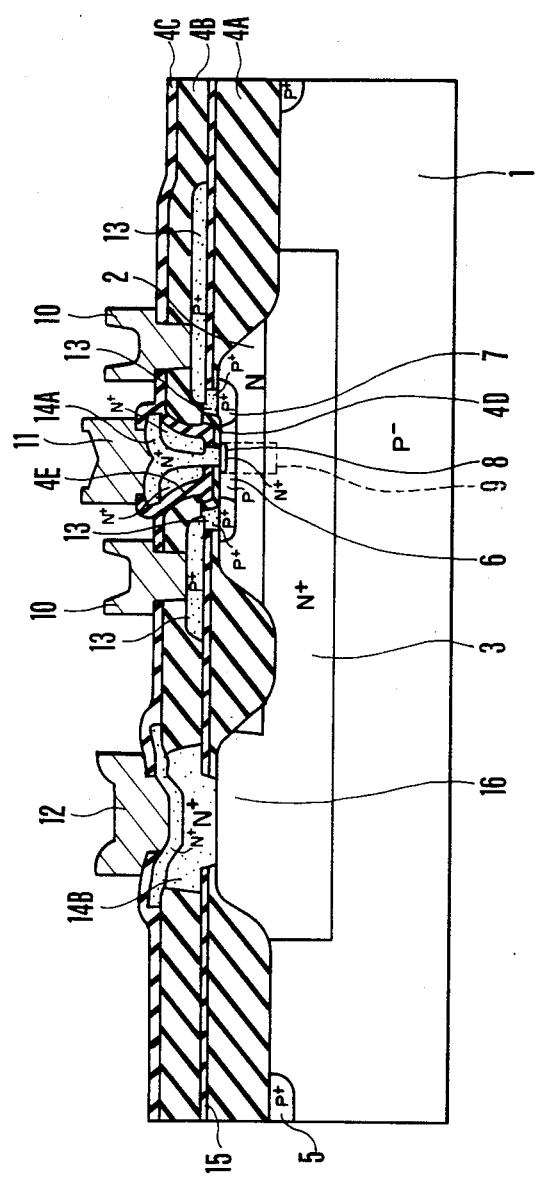
FIG. 27 is a sectional view showing a conventional bipolar transistor.

FIG. 1A shows a vertical npn bipolar transistor according to an embodiment of the present invention when viewed along the line B—B of FIG. 1B and FIG. 1B shows the electrode arrangement thereof. The same reference numerals in FIGS. 1(A) and 1(B) denote the same parts as in FIG. 27. As is apparent from comparison between FIG. 27 and FIGS. 1(A) and 1(B), in this embodiment, base, collector and emitter electrodes are formed within a single opening defined by an insulating film consisting of an oxide film 4A and a nitride film 15. More specifically, a base electrode connected to a polysilicon layer 13 containing a p-type impurity and a collector electrode connected to a polysilicon layer 14B containing an n-type impurity are formed at edges of the opening. An emitter electrode connected to a polysilicon layer 14A containing an n-type impurity is formed between the base and collector electrodes. The base, collector and emitter electrodes are isolated by oxide films 4B, 4D, and 4E. These electrodes are self-aligned in the manner described below. The polysilicon layer 14A serves as a diffusion source for forming an emitter region 8. The contact widths of the base and collector layers can each be decreased to 0.5 $\mu$m or less. The emitter width can also be easily decreased to 0.5 $\mu$m or less. Distances between the emitter and base contacts and between the emitter and collector contacts can be substantially the same and 0.5 $\mu$m or less each. The overall width of the transistor including the emitter, collector and base electrodes can be decreased to about ½ that of the conventional structure, and regions unnecessary for transistor operation can be minimized. Base-collector and collector-substrate capacitances can be reduced to achieve high-speed operation of the bipolar transistor. A collector diffusion layer 16 is formed in the n-type epitaxial layer 2 using the polysilicon layer 14B as a diffusion source.

Figure 2A:
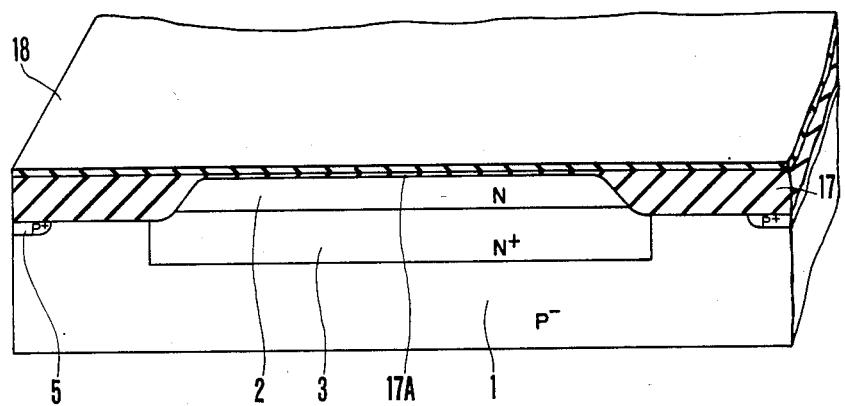
Figure 2B:
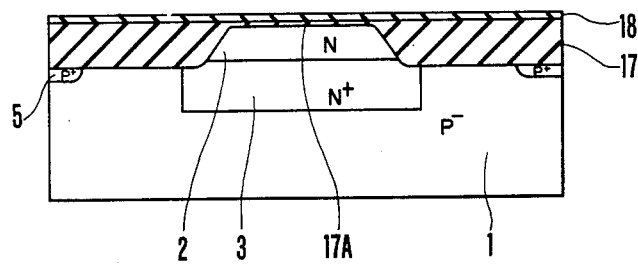
Figure 3A:
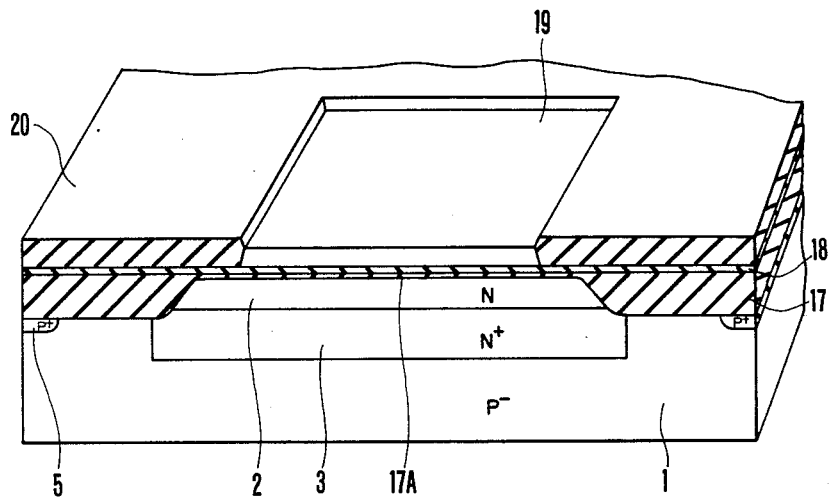
Figure 3B:
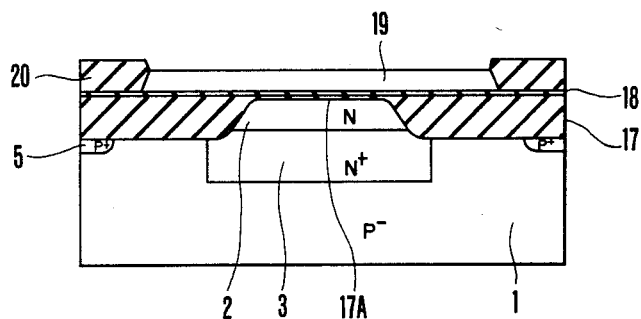
Figure 4A:
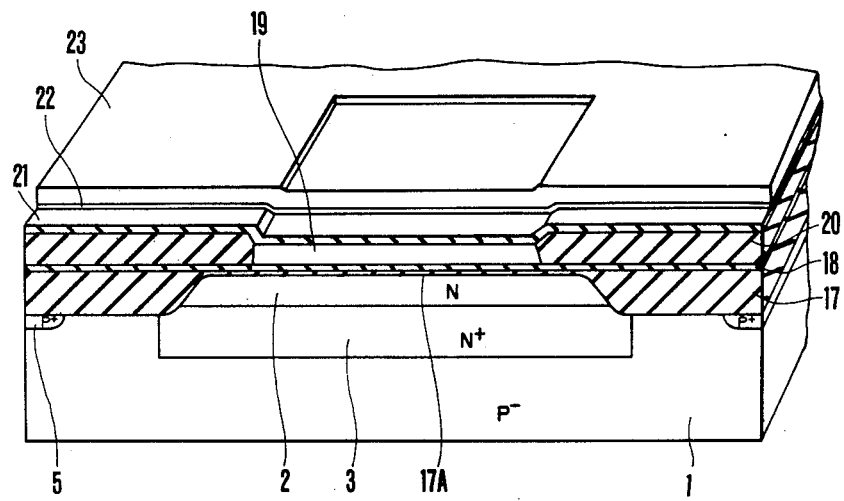
Figure 4B:
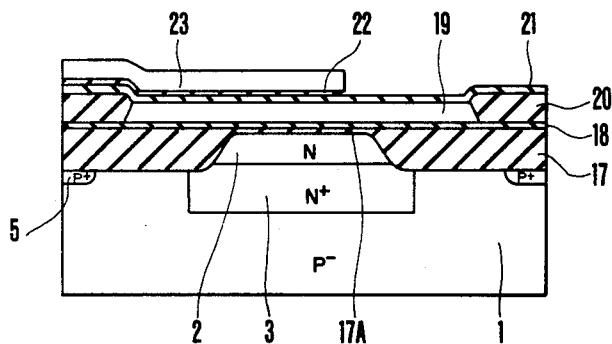
Figure 5A:
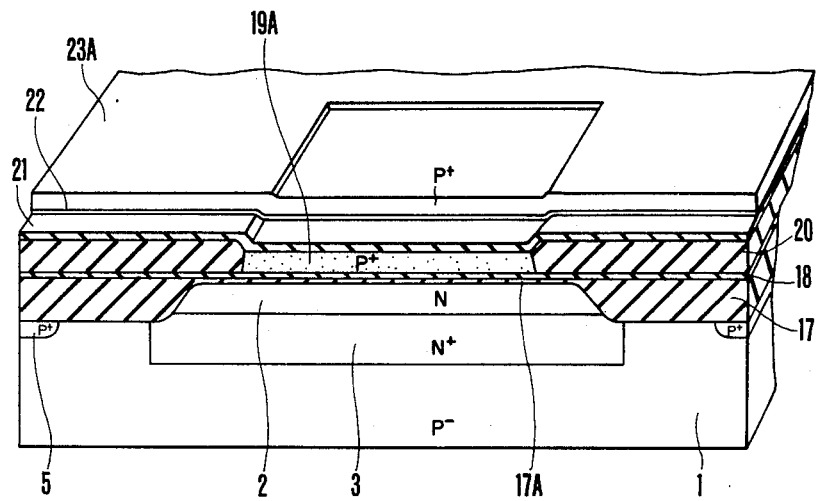
Figure 5B:
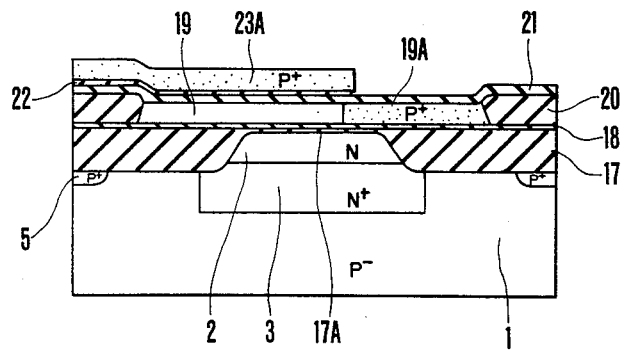
Figure 9A:
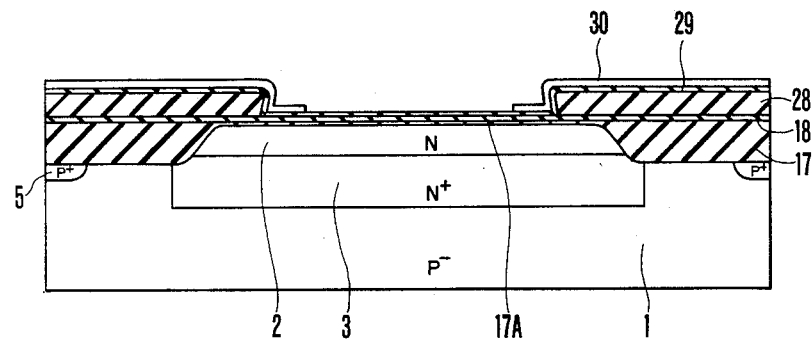
Figure 9B:
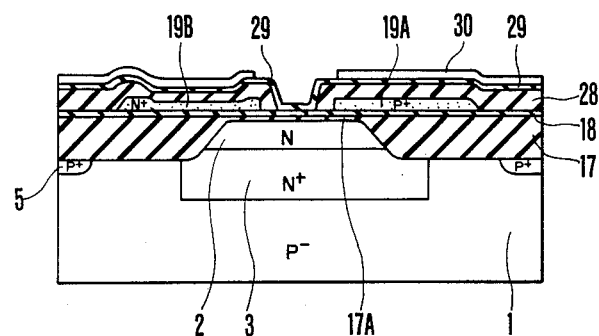
Figure 10:
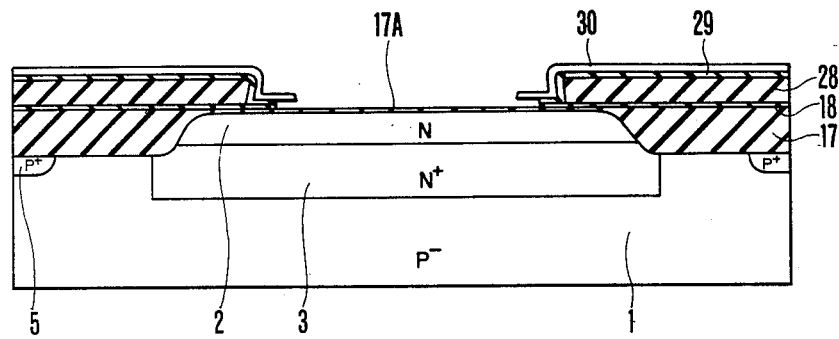
Figure 10:
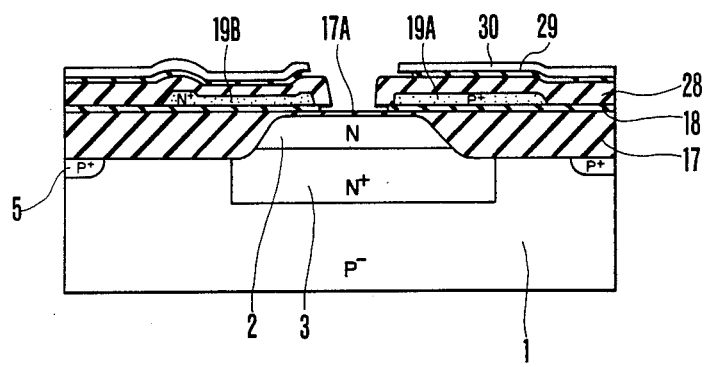
Figure 12:
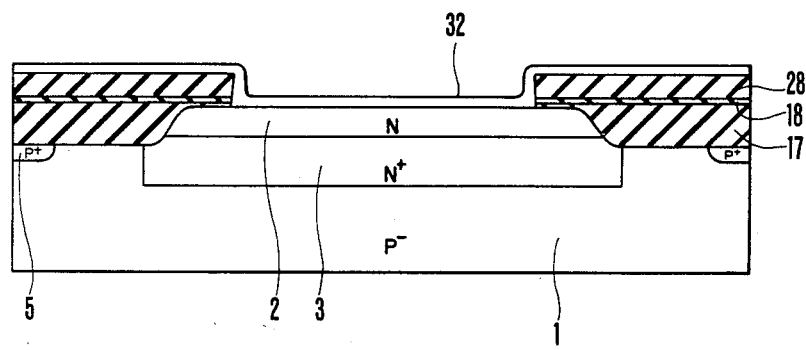
Figure 12:
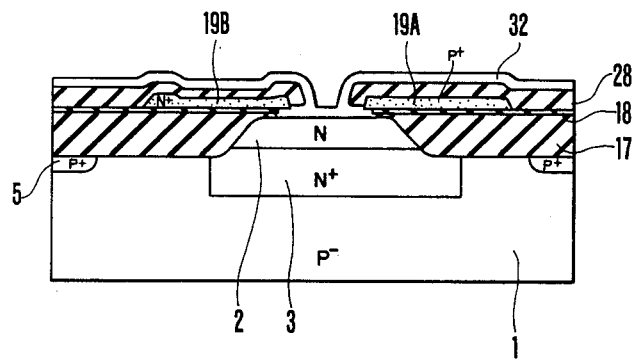
Figure 14A:
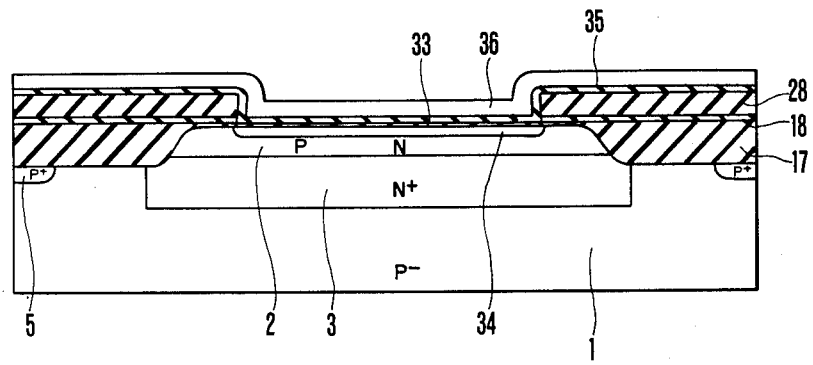
Figure 14B:
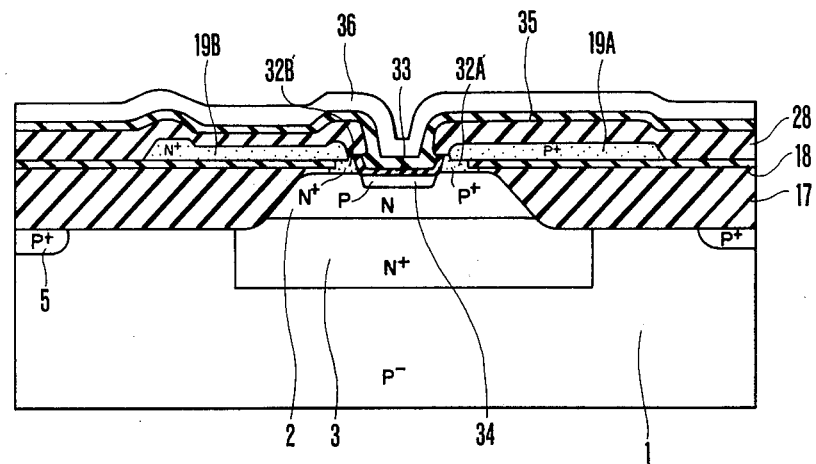
Figure 16A:
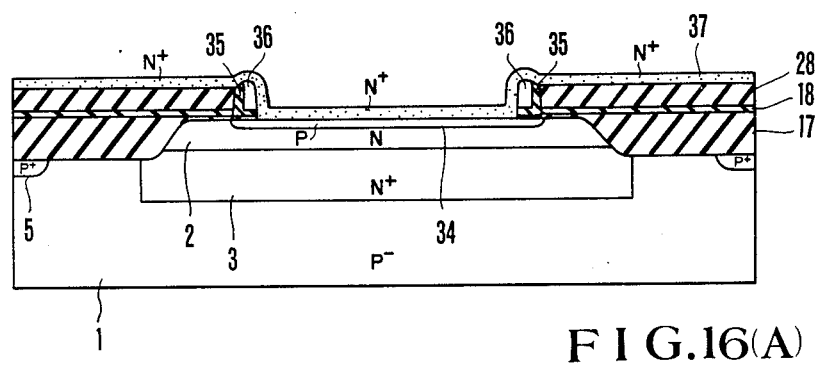
Figure 16B:
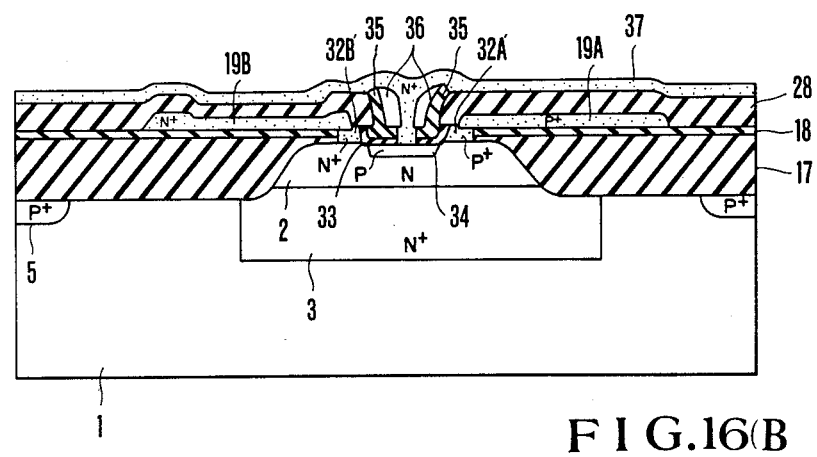
Figure 17A:
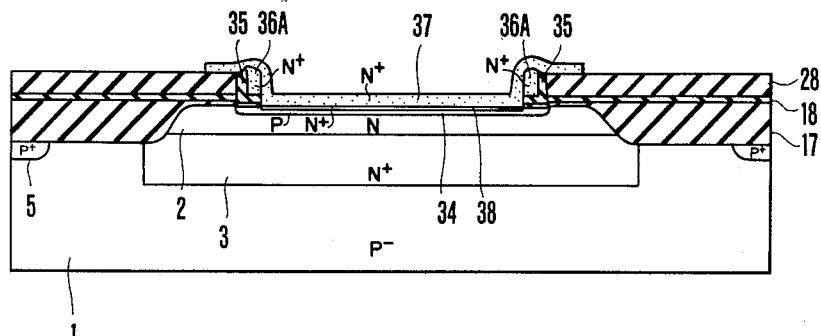
Figure 17B:
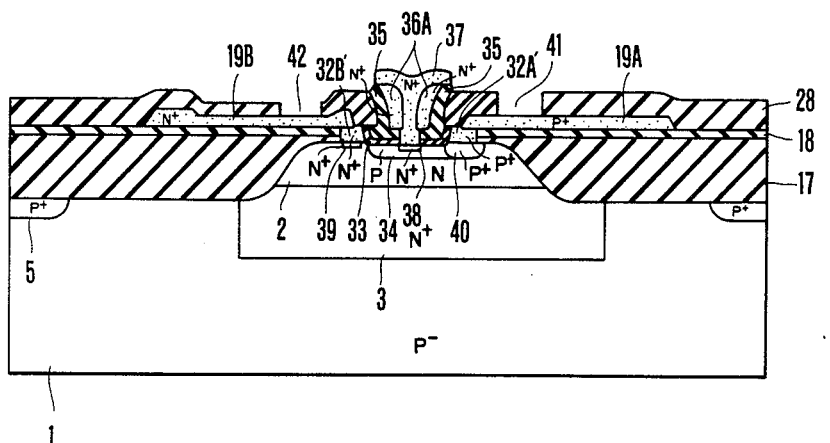

An example of the fabrication process of the above bipolar transistor is illustrated in FIGS. 2(A) to 18(A), in which FIGS. 2(A), 3(A), . . . 18(A) correspond to FIG. 1(A) and FIGS. 2(B), 3(B), . . . 18(B) correspond to the drawings taken along a line A—A of FIG. 1(B).

A 1-$\mu$m thick n+-type buried layer 3 having an arsenic concentration of $3 \times 10^{19}$ atoms/cm$^3$, a 1-$\mu$m thick n-type epitaxial layer 2 having a phosphorus concentration of $1 \times 10^{16}$ atoms/cm$^3$, and a p+-type channel cut layer 5 are formed in a p−-type silicon substrate 1 having a resistivity of 30 to 40 $\Omega$.cm. A thick oxide film (SiO$_2$ film) 17 is formed by LOCOS (Local Oxidation of Silicon) to flatten the surface. A 500-Å thick oxide film 17A is formed together with the SiO$_2$ film 17, and 1500-Å thick nitride film (Si$_3$N$_4$ film) 18 is then formed over the entire surface (FIGS. 2(A) and 2(B)). The thin oxide film 17A and the nitride film 18 constitute the field insulating film.

A 6000-Å thick nondoped polysilicon layer 19 is formed to cover the entire surface of the resultant structure, and an unnecessary region is selectively oxidized to form a 7500-Å thick oxide film 20 (FIGS. 3(A) and 3(B)). A 1000-Å thick oxide film 21, a 1000-Å thick nitride film 22 and a 6000-Å thick nondoped polysilicon layer 23 are sequentially formed on the oxide film 20 by CVD (Chemical Vapor Deposition). The polysilicon layer 23 and the nitride film 22 are patterned such that one end is located over the n-type epitaxial layer 2 under the thin oxide film 17A to prepare an ion implantation mask (FIGS. 4(A) and 4(B)). When boron ions are implanted as a p-type impurity in the entire surface, they are implanted only in a portion of the polysilicon layer 19 not masked by the polysilicon layer 23 and the nitride film 22, thus forming a boron-doped polysilicon layer 19A having an average boron concentration of $4 \times 10^{20}$ atoms/cm$^3$. The polysilicon layer 23 is also doped with boron ions and converted to boron-doped silicon layrr 23A (FIGS. 5(A) and 5(B)). The boron-doped silicon layer 23A is then removed by wet or dry etching. 0.2 $\mu$m of the oxide film 21 is side-etched using the nitride film 22 as a mask, so that the surface of the nondoped polysilicon layer 19 is partially exposed. The exposed portion is represented by reference numeral 24 (FIGS. 6(A) and 6(B)). After the nitride film 22 is removed, the nondoped polysilicon layer 19 is etched with an etching solution. The etching solution is selected such that the etching rate for nondoped polysilicon is about 10 times that for boron-doped polysilicon. An example of such an etching solution is potassium hydroxide. This etching forms a 1.5-$\mu$m wide groove 25. The groove 25 determines an active region of the transistor. Subsequently, the oxide film 21 is removed (FIGS. 7(A) and 7(B)).

Thermal oxidation is performed to form a 3000-Å thick oxide film 26. A 2-$\mu$m wide window 27 is formed for doping an n-type impurity in the nondoped polysilicon layer 19 (FIGS. 8(A) and 8(B)). Arsenic or phosphorus as an n-type impurity is ion-implanted or doped by a doped oxide method to convert the nondoped polysilicon layer 19 to an n-type doped polysilicon layer 19B having an impurity concentration of $5 \times 10^{20}$ atoms/cm$^3$. The resultant structure is annealed at a temperature of 900° C. for 20 minutes and is oxidized to form an oxide film 28, the thickness of which is about 3000 Å. A 1500-Å nitride film 29 and a 1000-Å polysilicon layer 30 are sequentially formed. A resist layer (not shown) is formed on the polysilicon layer 30 to sufficiently expose the groove edge portion serving as an active region with respect to the B—B section and to cover the edge of the groove by about 0.5 to 1 $\mu$m with respect to the A—A section. A window is formed in the polysilicon layer 30 by a known method such as plasma etching using the resist layer as a mask (FIGS. 9(A) and 9(B)). 3500 Å of the nitride film 29 is side-etched using the polysilicon layer 30 as a mask (FIGS. 10(A) and 10(B)), and the polysilicon layer 30 is removed. At this point, the bottom of the groove serving as the active region is protected by the oxide film 17A, and the polysilicon layers 19A and 19B serving as the base and collector electrodes have not yet been exposed and are protected by the oxide film 28 and the nitride film 18.

Exposed portions of the nitride films 18 and 29 in the groove in the A—A section are etched. In the B—B section, the nitride film 18 is side-etched, as indicated by reference numerals 31. The lower surfaces of the polysilicon layers 19A and 19B serving as the base and collector electrodes are exposed by 2000 Å in the B—B section (FIG. 11). After removing the exposed oxide film 17A, a 2000-Å thick nondoped polysilicon layer 32 is formed by low-pressure CVD on the entire surface to fill the side-etched portions 31 (FIGS. 12(A) and 12(B)). Since the polysilicon layer formed by low-pressure CVD is grown isotropically from the exposed surface, the silicon layer 32 fills the exposed surface completely, including the side-etched portions 31. Subsequently, the polysilicon layer 32 is removed by isotropic etching. In this case, the side-etched portions 31 are filled by polysilicon layers 32A and 32B in the B—B section. However, the polysilicon layer 32 is not left on the A—A section (FIGS. 13(A) and 13(B)). The silicon layer (19A+32A) is completely isolated from the silicon layer (19B+32B), as is apparent from FIG. 13B. These layers can be used as independent functional elements as the base and collector electrodes. Therefore, the polysilicon layers as the base and collector electrodes are formed at opposite edges of the single opening.

A 700-Å thick oxide film 33 is formed in the inner surface of the groove by thermal oxidation at a temperature of 900° C. for 20 minutes. By this process, impurity ions are diffused from the impurity-doped polysilicon layers 19A and 19B to the nondoped polysilicon layers 32A and 32B contacting the layers 19A and 19B, thereby forming a polysilicon layer 32A' doped with a p-type impurity and a polysilicon layer 32B' doped with an n-type impurity, respectively. Boron ions are implanted through the oxide film 33 at an acceleration voltage of 25 keV and a dose of $1.5 \times 10^{13}$ ions/cm$^2$ to form a 2-μm deep base region 34. A 1000-Å thick oxide film 35 and a 4500-Å thick polysilicon layer 36 are sequentially formed by CVD to form a self-aligned emitter opening (FIGS. 14(A) and 14(B)). The polysilicon layer 36 is removed by an anisotropic etching technique such as RIE (Reactive Ion Etching) to leave portions only on groove side walls (FIGS. 15(A) and 15(B)) ("Reactive Ion Etching of Aluminum using SiCl$_4$", Journal of Vacuum Science & Technology, Vol. 20, 1982, pp. 186-190). The oxide films 35 and 33 are sequentially etched by a combination of anisotropic etching and wet etching (for removing the damage inflicted by anisotropic etching) to form an opening and expose a silicon surface portion of the base region 34. The oxide films 35 and 33 are anisotropically etched by about 1300 Å and then completely removed by wet etching. A 3000-Å thick arsenic-doped polysilicon layer 37 having a concentration of $1 \times 10^{21}$ atoms/cm$^3$ is formed to cover the entire surface (FIGS. 16(A) and 16(B)). An excess portion of the polysilicon layer 37 is removed by dry etching. The resultant structure is then annealed to diffuse the n-type impurity from the polysilicon layer 37 into the monocrystalline silicon of the base region 34, thereby forming a 0.1-μm deep emitter diffusion region 38. In this step, the polysilicon layers 19B and 32B act as diffusion sources to form a collector contact diffusion region 39. Similarly, the polysilicon layers 19A and 32A act as diffusion sources to form a base contact region 40. Arsenic is also diffused in the polysilicon layer 36 contacting the polysilicon layer 37 to form an arsenic-doped polysilicon layer 36A. Subsequently, base and collector contact windows 41 and 42 are formed in the oxide film 28 (FIGS. 17(A) and 17(B)). An oxide film 43 is formed by CVD to cover the entire surface, and emitter, base, and collector contact windows are opened. Collector, emitter, and base metal electrodes 44, 45, and 46 of a metal such as aluminum are formed (FIGS. 18(A) and 18(B)).

The structural parameters of the prepared bipolar transistor are defined in FIGS. 18(A) and 18(B). Reference symbol $W_F$ denotes the width of a base edge region in the A—A section; $W_{CC}$, the width of the collector contact diffusion region 39; $W_{EC}$, the width of the emitter diffusion region 38; $W_{COE}$, the width of the base contact region; $W_{BC}$, the width of the base region 34; $W_F'$, the width of the base edge region in the B—B section; $W_E$, the width of the emitter diffusion window; $W_C$, the width of the collector contact diffusion window; $W_B$, the width of the base contact diffusion window; $W_{OX1}$, the distance between the emitter diffusion window and the collector contact diffusion window; and $W_{OX2}$, the distance between the emitter diffusion window and the base contact diffusion window. $W_{OX1}$ is substantially equal to $W_{OX2}$, 0.5 μm or less, and the same as the thickness of the oxide film 28.

Figure 19:
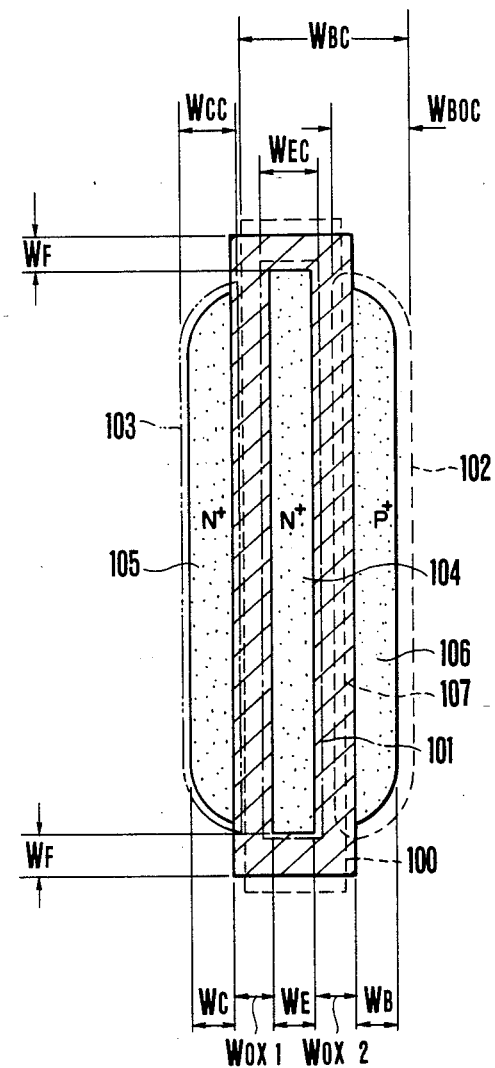
FIG. 19 is a sectional view of the transistor in FIG. 1(A) taken along a direction different from that in FIG. 1(A)

FIG. 19 shows a sectional structure when the interface between the semiconductor substrate and the polysilicon layer and insulating film is viewed from the top. The region 100 surrounded by the short broken line represents the base region excluding the base contact diffusion region, the region surrounded by the alternate long and short dashed line 101 represents the emitter region, the region surrounded by the long broken line 102 represents the diffusion region formed by diffusion from the p+-type polysilicon, and the region surrounded by the alternate long and two short dashed line 103 represents the diffusion region formed by diffusion from the n+-type polysilicon. The regions 104, 105 filled with crosses represent n+-type polysilicon portions, i.e., the polysilicon layer 37 as the emitter electrode region and the polysilicon layer 32B' as the collector electrode region. The region 106 filled with dots represents a p+-type polysilicon portion, i.e., the polysilicon layer 32A' as the base region. Hatched regions 107 represent the oxide films for insulating the above layers and portions. The solid line in FIG. 19 indicates a boundary between the substrate and the polysilicon and oxide films.

As is apparent from FIG. 19, the collector contact diffusion region and the emitter diffusion region are self-aligned with the base contact diffusion region. The base and collector electrodes sandwiching the emitter oppose each other, and all are formed in the single opening. The distances from the emitter electrode to the base and collector electrodes are the same and very short. The area occupied by the transistor and its collector-substrate capacitance are reduced, and high-speed operation can be achieved compared to the conventional structure of FIG. 27.

Figure 20:
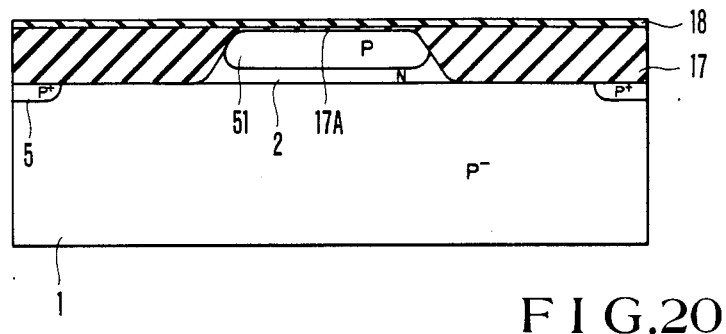
FIGS. 20 and 21 are sectional views showing the steps for manufacturing a bipolar transistor according to another embodiment of the present invention.
Figure 21:
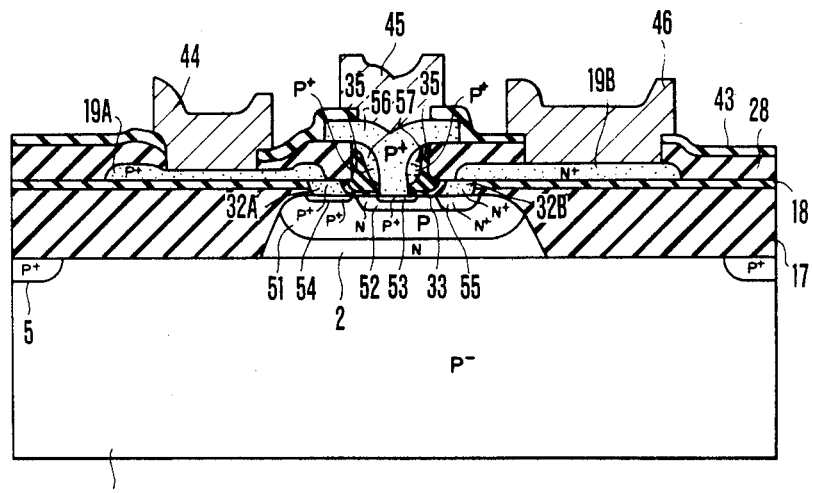

The above embodiment exemplifies an npn transistor. However, n-type and p-type conductivities can be interchanged to form a pnp transistor in the same manner as described above. The pnp transistor can be formed together with the npn transistor on a single substrate with a small number of changes and additional steps. A pnp transistor is illustrated in FIGS. 20 and 21. FIGS. 20 and 21 are sectional views taken along the line B—B of FIG. 1(B).

A p-type impurity is implanted in an n-type epitaxial layer 2 through a thin oxide film to form a p-type epitaxial layer 51 for the pnp transistor. After LOCOS is performed, a thin oxide film 17A and a nitride film 18 are formed (FIG. 20). The subsequent steps are the same as those in the fabrication of an npn transistor until the formation of the thin oxide film 33 in FIGS. 14(A) and 14(B). Phosphorus ions are implanted through the oxide film 33 to form a base region 52. An oxide film 35 and a polysilicon layer 57 are sequentially formed. The polysilicon layer 57 is partially removed by anisotropic etching, and the oxide film 35 is partially etched by a combination of anisotropic etching and wet etching to expose a silicon surface portion serving as an emitter region 53. A boron-doped polysilicon layer 56 is formed and boron is diffused by annealing to form an emitter diffusion region 53. At the same time, a collector contact diffusion region 54 and a base contact region 55 are formed. The subsequent steps are the same as those in the fabrication process of the npn transistor. A finished structure with metal electrodes is illustrated in FIG. 21. Reference numerals 56 and 57 denote p-type impurity, i.e., boron-doped polysilicon layers serving as the emitter electrode. Polysilicon layers 19A and 32A doped with a p-type impurity constitute the collector electrode, and polysilicon layers 19B and 32B doped with an n-type impurity constitute the base electrode.

The vertical pnp and npn transistors can be easily formed on a single chip to constitute a high-performance complementary bipolar transistor.

In the above embodiments, the electrodes are made of polycrystalline silicon. However, part or all of polysilicon may be replaced with a silicide. Alternatively, a metal may be selectively grown on only monocrystalline or polycrystalline silicon to constitute part of the electrodes.

Figure 22:
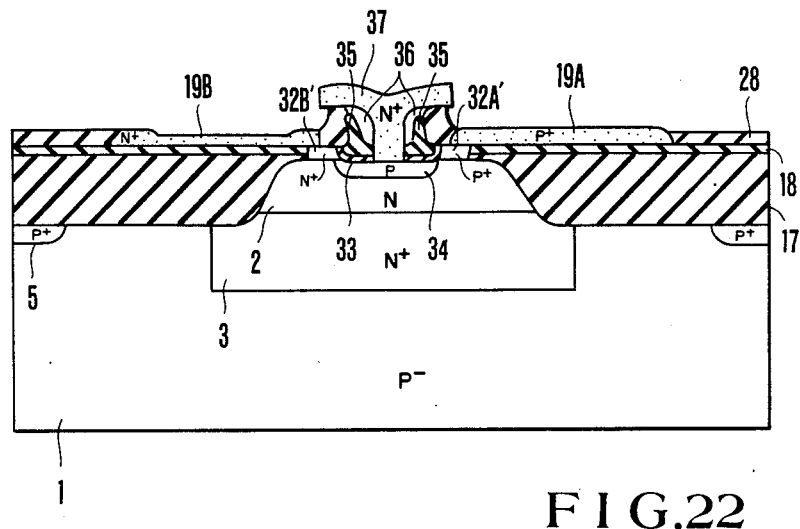
FIGS. 22 to 25 are sectional views showing a bipolar transistor according to still another embodiment of the present invention.
Figure 23:
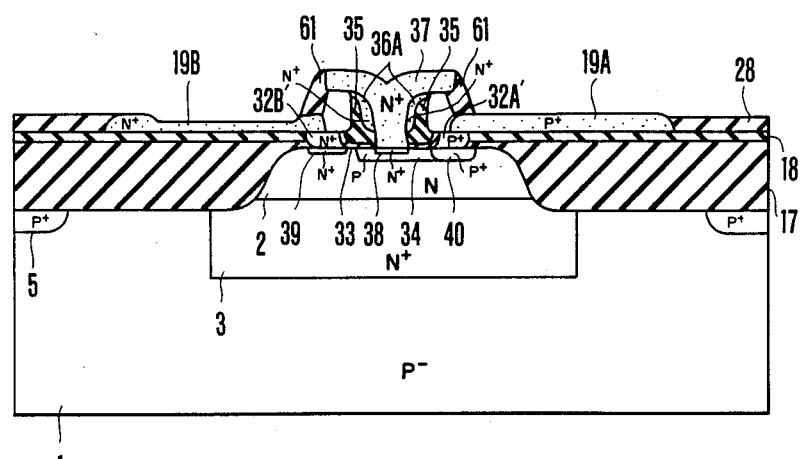
Figure 24:
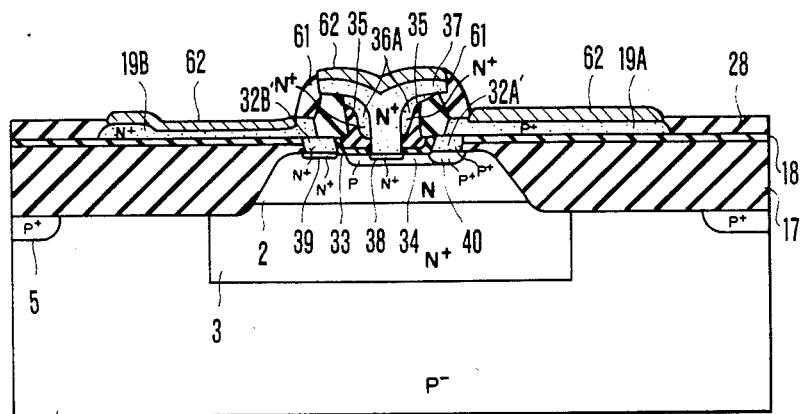
Figure 25:
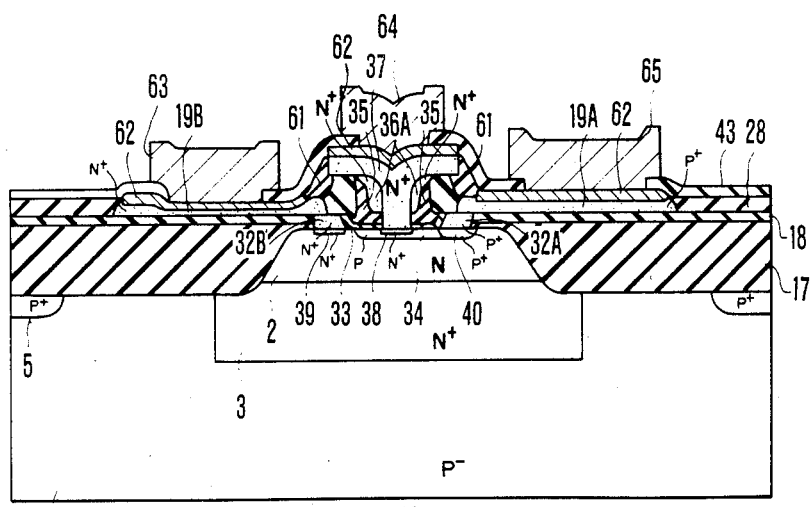

FIGS. 22 to 24 show still another embodiment in which part of polysilicon is replaced with a silicide. FIGS. 22 to 24 are sectional views taken along the line B—B of FIG. 1(B). A polysilicon layer 37 doped with an n-type impurity is formed and etching is performed using the resultant layer as an etching mask to expose the surfaces of the p-type polysilicon layer 19A serving as the base electrode region and the n-type polysilicon layer 19B serving as the collector electrode region (FIG. 22). Subsequent annealing produces an emitter diffusion region 38. An oxide film 61 is formed by CVD and etched by anisotropic etching to leave it around only the emitter region (FIG. 23). A metal layer such as a Pt layer is formed and alloyed with silicon by annealing to constitute a silicide layer 62. A nonalloyed metal layer on the oxide film is removed (FIG. 24), and an oxide film 43 is formed and etched to form contact holes. Finally, collector, emitter, and base metal electrodes 63, 64, and 65 of aluminum are formed (FIG. 25).

Figure 26:
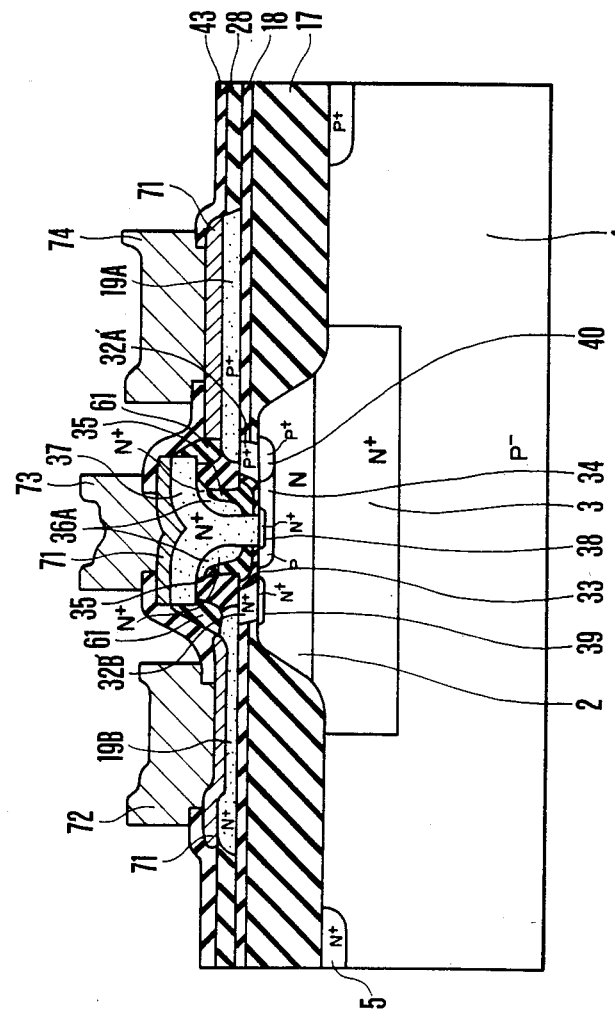
FIG. 26 is a sectional view showing a bipolar transistor according to still another embodiment of the present invention.

FIG. 26 shows still another embodiment employing selective growth of a metal. A metal layer 71 is selectively grown on the surfaces of the polysilicon layers 19A, 19B, and 37 exposed in the step shown in FIG. 23. After contact holes are formed in the oxide film 43, a thick metal layer of aluminum is formed and patterned to constitute collector, emitter and base metal electrodes 72, 73, and 74. In the above embodiment, the n+-type buried layer 3 is formed in the substrate. However, the present invention is also applicable if the substrate does not have an n+-type buried layer. In the above embodiment, the thick oxide film 17 is formed. However, the present invention is also applicable when such a film is not formed.

According to the present invention as described above, the collector and base electrodes are formed within a single opening, and the emitter electrode is formed between the collector and base electrodes within the single opening. The electrodes are isolated by insulating interlayers. The area occupied by the transistor can be decreased to ½ that of the conventional structure. For this reason, a high-density, high-integration LSI can be fabricated. Since the collector-substrate capacitance is decreased, high-speed operation can be achieved. Polysilicon or a silicide is used to constitute the electrode regions, so that the emitter, base, and collector regions are connected to the metal electrodes through polysilicon or silicide. The emitter, base, and collector regions are therefore free from Schottky tunneling, and stable high-speed operation is guaranteed even with shallow junctions. High-performance vertical pnp and npn transistors can be easily formed on a single chip. Because of complicated fabrication processes or the use of a lateral pnp transistor with poor characteristics in place of a vertical pnp transistor to avoid such processes, complementary bipolar LSIs with vertical transistors have not received a great deal of attention. The present invention, however, can provide a high-speed complementary bipolar LSI with low power consumption. A semiconductor layer of an SOS structure can be used in place of the semiconductor substrate.

What is claimed is:

1. A method of manufacturing a bipolar transistor, comprising the steps of:
    forming a first insulating film as a field insulating film on a semiconductor substrate having a collector region of a first conductivity type;
    forming a first nondoped semiconductor layer on said first insulating film;
    oxidizing said first nondoped semiconductor layer except for a part over said collector region to form a second insulating film;
    doping an impurity of a second conductivity type in part of a region of said first nondoped semiconductor layer, thereby forming a first doped region;
    partially etching a part of a nondoped portion of said first nondoped semiconductor layer which is adjacent to said first doped region and located on said collector region, thereby forming a groove in said first nondoped semiconductor layer;
    doping an impurity of the first conductivity type to form a second doped region in a region of said first nondoped semiconductor layer which excludes said first doped region;
    side-etching said first insulating film in the groove excluding a vicinity of said second insulating film to expose parts of lower surfaces of said second doped semiconductor layer of the first conductivity type and said first doped semiconductor layer of the second conductivity type;

filling side-etched portions with a second semiconductor layer;

doping an impurity of the second conductivity type in a surface of said collector region in the groove to form a base region;

forming a third insulating film on the entire surface;

forming a third semiconductor layer on the third insulating film;

removing said third semiconductor layer except for portions on the side wall of the groove by using anisotropic etching;

removing portions of said third insulating film to expose a surface of said base region at the center of the groove;

forming a fourth semiconductor layer containing an impurity of the first conductivity type on the surface of said base region and in a region surrounded by remaining portions of said third insulating film and said third semiconductor layer; and diffusing the impurity of the first conductivity type from said fourth semiconductor layer into said base region to form an emitter region.

2. A method according to claim 1, wherein the impurity of the first conductivity type is an n-type impurity, and the impurity of the second conductivity type is a p-type impurity.

3. A method according to claim 1, wherein the impurity of the first conductivity type is a p-type impurity, and the impurity of the second conductivity type is an n-type impurity.

4. A method according to claim 1, wherein the step of forming the groove in said first semiconductor layer includes the steps of:

forming an oxide film on said first nondoped semiconductor layer;

forming a nitride film on said oxide film and patterning said nitride film;

etching said oxide film using said nitride film as a mask and partially side-etching said oxide film under said nitride film to partially expose said first nondoped semiconductor layer excluding said first doped region; and partially etching an exposed portion of said first nondoped semiconductor layer to form the groove.

5. A method according to claim 1, wherein said first insulating film consists of a first oxide film and a first nitride film.

6. A method according to claim 1, wherein said semiconductor layers are made of a material selected from the group consisting of polysilicon and a silicide.

7. A method of manufacturing a bipolar transistor, comprising the steps of:

forming a first insulating film as a field insulating film on a semiconductor substrate having a collector region of a first conductivity type;

forming a first nondoped semiconductor layer on said first insulating film;

oxidizing said first nondoped semiconductor layer except for a part over said collector region to form a second insulating film;

doping an impurity of a first conductivity type in part of a region of said first nondoped semiconductor layer, thereby forming a first doped region;

partially etching a pair of a nondoped portion of said first nondoped semiconductor layer which is adjacent to said first doped region and located on said collector region, thereby forming a groove in said first nondoped semiconductor layer;

doping an impurity of the second conductivity type to form a second doped region in a region of said first nondoped semiconductor layer which excludes said first doped region;

side-etching said first insulating film in the groove excluding a vicinity of said second insulating film to expose parts of lower surfaces of said second doped semiconductor layer of the first conductivity type and said first doped semiconductor layer of the second conductivity type;

filling side-etched portions with a second semiconductor layer;

doping an impurity of the second conductivity type in a surface of said collector region in the groove to form a base region;

forming a third insulating film on the entire surface;

forming a third semiconductor layer on the third insulating film;

removing said third semiconductor layer except for portions on the side wall of the groove by using anisotropic etching;

removing portions of said third insulating film to expose a surface of said base region at the center of the groove;

forming a fourth semiconductor layer containing an impurity of the first conductivity type on the surface of said base region and in a region surrounded by remaining portions of said third insulating film and said third semiconductor layer; and diffusing the impurity of the first conductivity type from said fourth semiconductor layer into said base region to form an emitter region.

* * * * *